(12) United States Patent
Clark

(10) Patent No.: US 7,231,572 B2
(45) Date of Patent: Jun. 12, 2007

(54) METHOD AND CIRCUIT FOR PARAMETRIC TESTING OF INTEGRATED CIRCUITS WITH AN EXCLUSIVE-OR LOGIC TREE

(75) Inventor: Iain R. Clark, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 151 days.

(21) Appl. No.: 11/106,743

(22) Filed: Apr. 15, 2005

(65) Prior Publication Data

US 2006/0236169 A1    Oct. 19, 2006

(51) Int. Cl.
*G01R 31/28*    (2006.01)
(52) U.S. Cl. .................. 714/742; 714/25; 714/724; 326/52
(58) Field of Classification Search ............ None
See application file for complete search history.

(56) References Cited

U.S. PATENT DOCUMENTS 5,621,740 A * 4/1997 Kamada .................... 714/727
5,966,029 A * 10/1999 Tarrab et al. .............. 326/52
7,127,652 B2 * 10/2006 Norrgard et al. ........... 714/742
2003/0115521 A1 * 6/2003 Rajski et al. ............... 714/724

OTHER PUBLICATIONS

National Semiconductor, "PC87372 LPC SuperI/O with Glue Functions", Oct. 2002, found at www.national.com or www.winbond.com. pp. 1, 21-22, 28-29 and 121.*
Cirrus Logic, "CS4281 Programming Manual", Mar. 2000, found at www.cirrus.com. pp. 1, 200 and 227.*
Trident Microsystems, "Trident 4DWAVE-DX Technical Reference Manual", Apr. 1998. pp. i-ii, iv and 30. Found at http://www.alsa-project.org/alsa/ftp/manuals/trident/4dwave_dx.pdf.*

* cited by examiner

*Primary Examiner*—Albert Decady
*Assistant Examiner*—John P. Trimmings
(74) *Attorney, Agent, or Firm*—Eric James Whitesell

(57) ABSTRACT

A circuit for parametric testing of an integrated circuit includes an integrated circuit having a plurality of input buffers and a plurality of XOR gates. The plurality of XOR gates have a first input that is connected to an output of one of the input buffers and having a second input that is connected to an output of a preceding XOR gate to form an XOR logic tree.

4 Claims, 5 Drawing Sheets

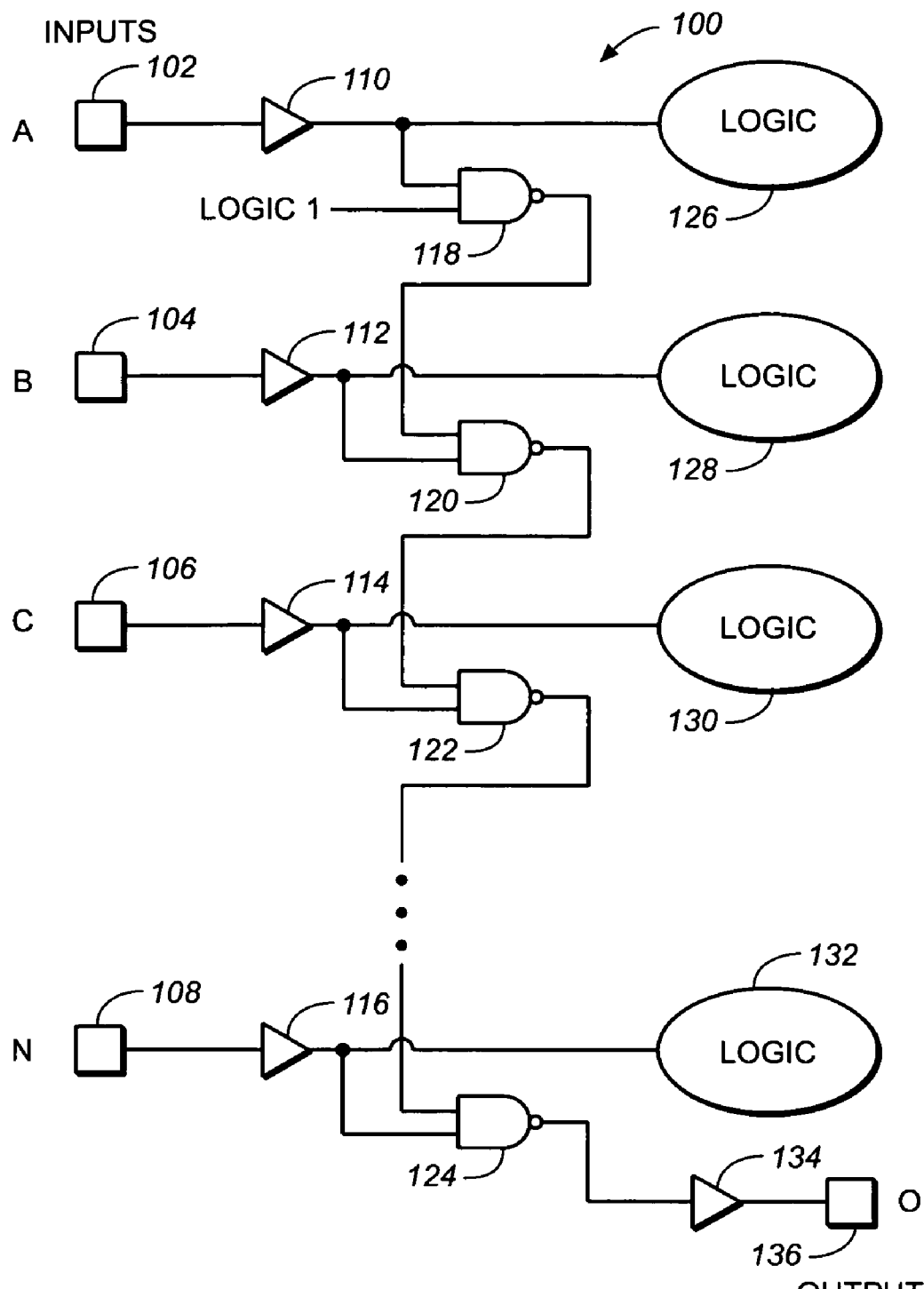
FIG._1
*(PRIOR ART)*

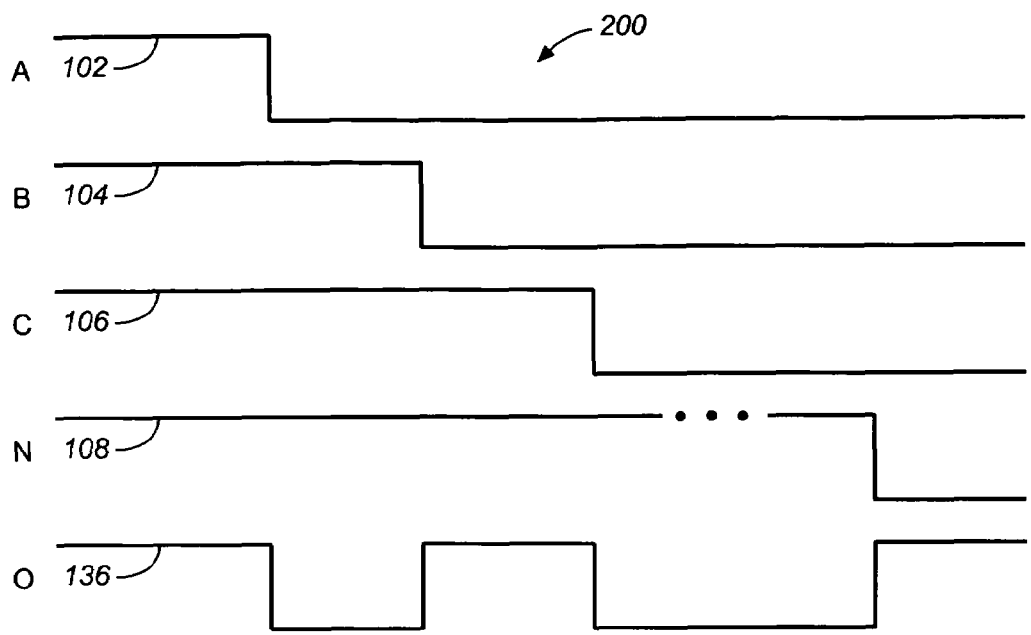
FIG._2
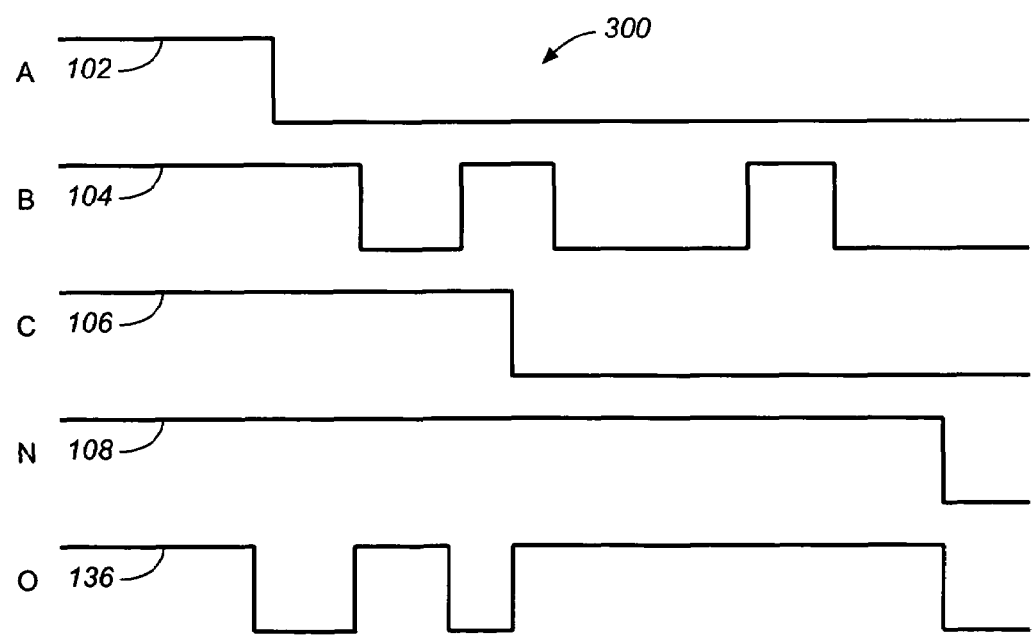
FIG._3

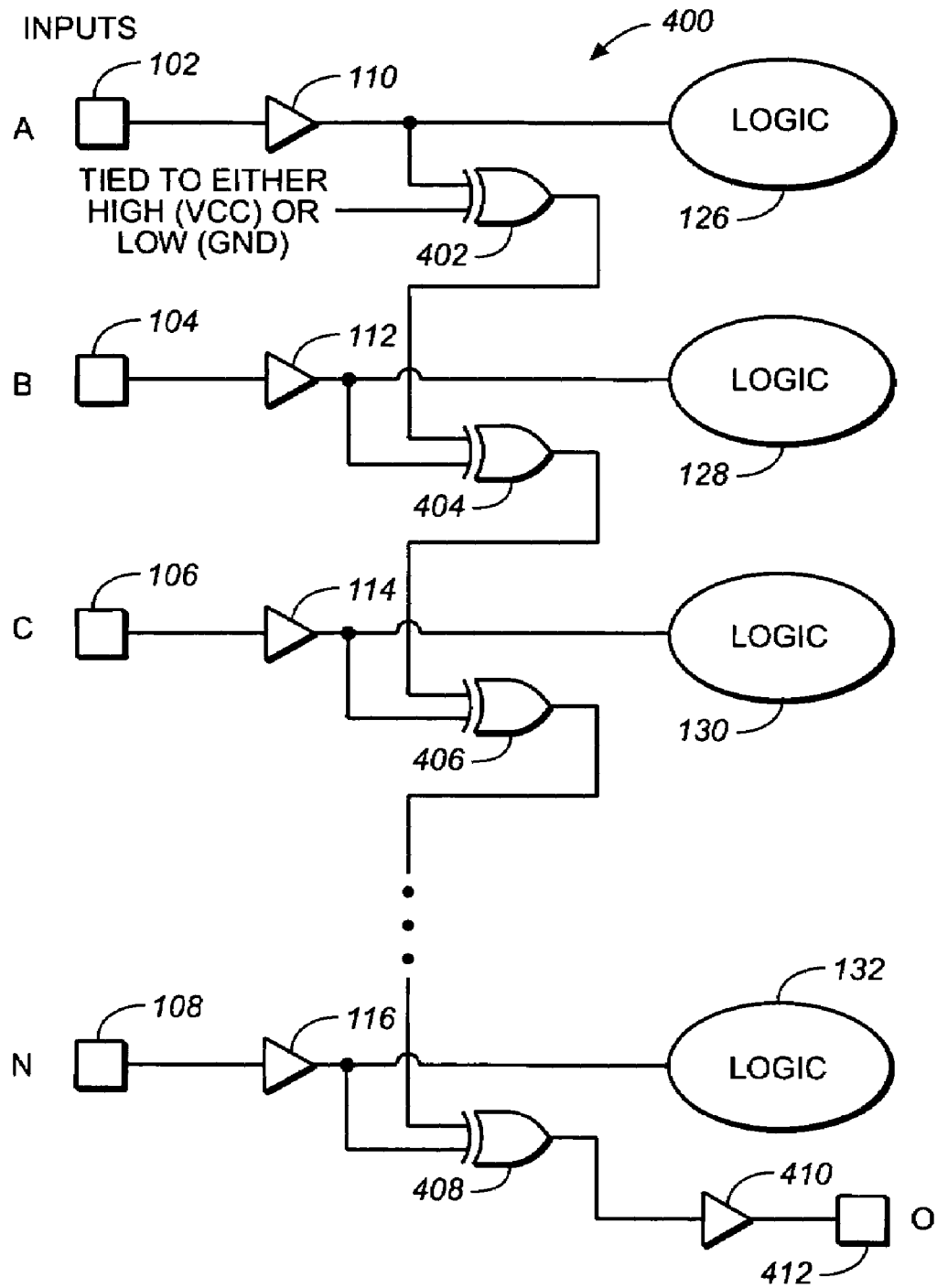
FIG._4

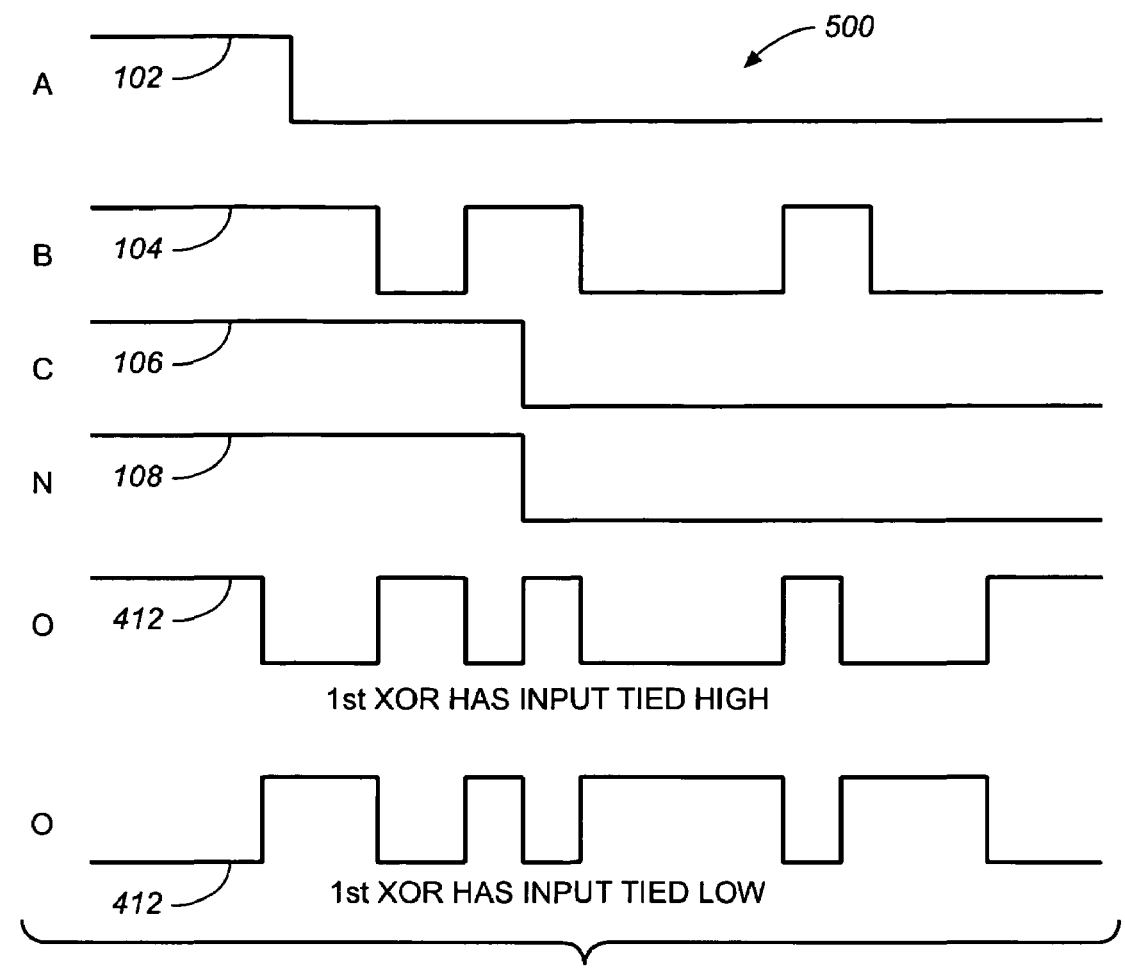
FIG._5

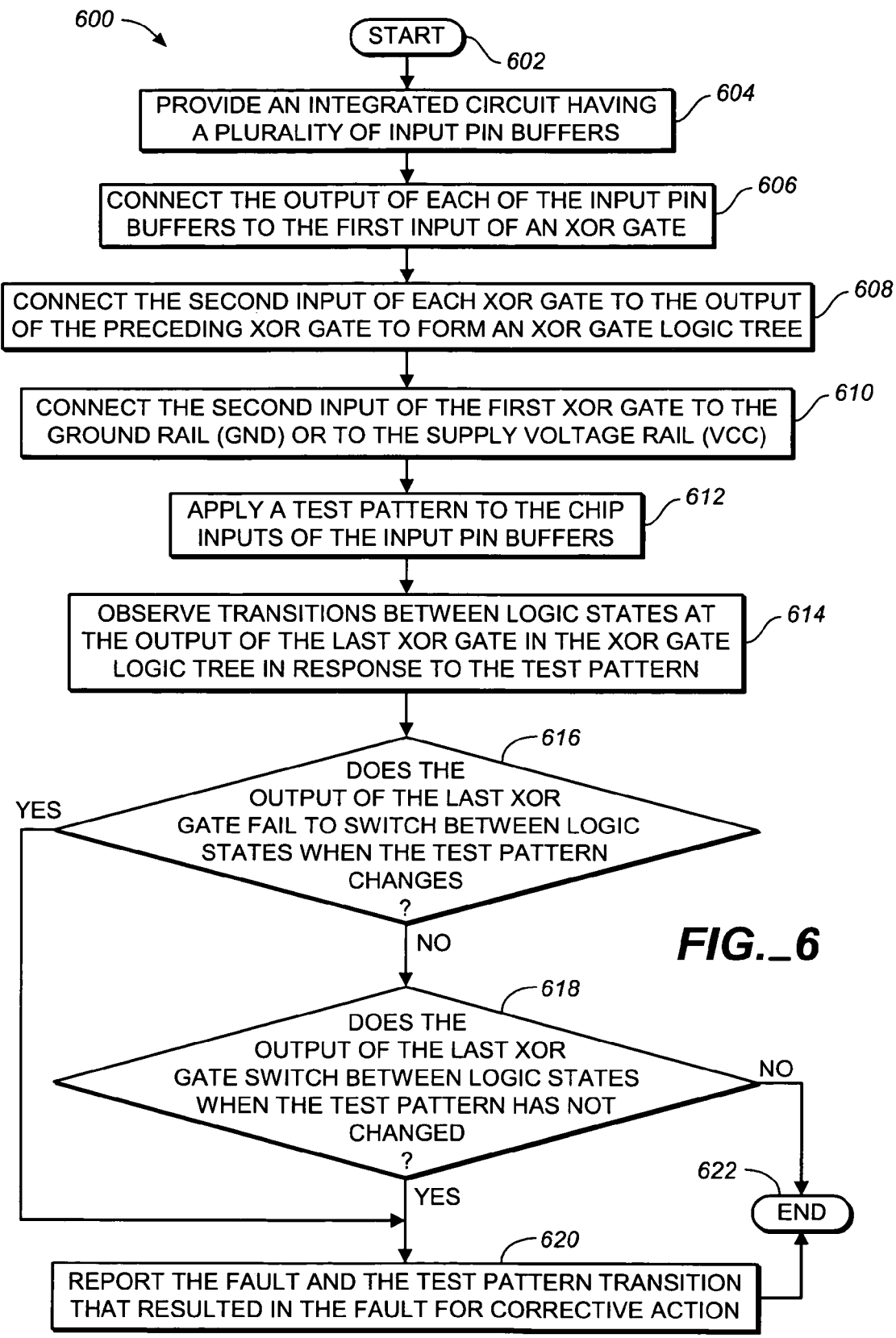
FIG._6

METHOD AND CIRCUIT FOR PARAMETRIC TESTING OF INTEGRATED CIRCUITS WITH AN EXCLUSIVE-OR LOGIC TREE

BACKGROUND OF THE INVENTION

1. Field of the Invention

The present invention is directed to testing integrated circuits. More specifically, but without limitation thereto, the present invention is directed to parametric testing of an integrated circuit.

2. Description of Related Art

Parametric testing is used to verify that the input thresholds for logic zero and logic one of an integrated circuit meet performance specifications. Typically, the chip inputs are connected to a test pattern generator, and the output of each chip input buffer is connected to one input of a NAND gate to form a chain or logic tree of NAND gates. If all chip input buffers are performing properly, then the output of the last NAND gate in the logic tree will transition each time a single input of the chip changes from a one to a zero or from a zero to a one provided that all the chip inputs below the changed input are equal to a one. A fault is detected if the output of the logic tree does not toggle when one of the chip inputs toggles.

SUMMARY OF THE INVENTION

In one embodiment, a circuit for parametric testing of an integrated circuit includes:
an integrated circuit having a plurality of input buffers; and
a plurality of XOR gates having a first input that is connected to an output of one of the input buffers and having a second input that is connected to an output of a preceding XOR gate to form an XOR logic tree.

In another embodiment, a method for parametric testing of an integrated circuit includes steps of:
(a) providing an integrated circuit having a plurality of input buffers;
(b) connecting an output of each of the input buffers to a first input of one of a plurality of XOR gates respectively; and
(c) connecting a second input of each of the plurality of XOR gates to an output of a preceding XOR gate respectively to form an XOR logic tree.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein:

FIG. 1 illustrates a NAND logic tree of the prior art;

FIG. 2 illustrates a normal timing diagram for the NAND logic tree of FIG. 1;

FIG. 3 illustrates a blocked timing diagram for the NAND logic tree of FIG. 1;

FIG. 4 illustrates an XOR logic tree for generating an unblocked test signal;

FIG. 5 illustrates a timing diagram for the XOR logic tree of FIG. 4; and FIG. 6 illustrates a flow chart of a method of testing input buffers in an integrated circuit.

Common but well-understood elements that are useful or necessary in a commercially feasible embodiment are often not depicted in order to facilitate a less obstructed view of the illustrated embodiments.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order of occurrence; however, practitioners of the art will understand that a specific order is not a requirement. Also, the terms and expressions used in the description have the ordinary meanings accorded to such terms and expressions in the corresponding respective areas of inquiry and study except where other meanings have been specifically set forth herein.

The purpose of parametric testing is to check the input threshold for a logic one and a logic zero at each input of an integrated circuit, also called a chip, for possible failures under performance specification limits. In previous methods used for testing chip inputs of an integrated circuit, a NAND logic tree is constructed to chain the outputs of the input buffers and to connect the chained output signal to a chip output for observation and verification during chip testing.

FIG. 1 illustrates a NAND logic tree 100 of the prior art. Shown in FIG. 1 are input pins 102, 104, 106, and 108, input buffers 110, 112, 114, and 116, NAND gates 118, 120, 122, and 124, logic function clouds 126, 128, 130, and 132, a NAND logic tree output buffer 134, and a NAND logic tree test output pin 136.

In FIG. 1, the input pins 102, 104, 106, and 108 are typically provided in an integrated circuit for introducing signals to be processed according to the functions performed by the logic function clouds 126, 128, 130, and 132. To simplify the illustration, four input pins are shown; however, the following description is intended to cover any number of input pins greater than one. The NAND gates 118, 120, 122, and 124, the NAND gate logic output buffer 134, and the NAND logic tree test output pin 136 constitute a circuit for testing the input buffers 110, 112, 114, and 116.

Each of the input buffers 110, 112, 114, and 116 is connected respectively to one of the input pins 102, 104, 106, and 108 to propagate an input signal from an input pin to one of the logic function clouds 126, 128, 130, and 132. The output of each of the input buffers 110, 112, 114, and 116 is connected respectively to one input of each of the NAND gates 118, 120, 122, and 124. The other input of each of the NAND gates 118, 120, 122, and 124 is connected to the output of the preceding NAND gate in the NAND logic tree 100. The output of the NAND gate preceding the first NAND gate 118 in the NAND logic tree 100 is defined as a logic one, which is provided by connecting one input of the first NAND gate 118 to the supply voltage rail VCC.

When a test pattern signal is applied to each of the input pins 102, 104, 106, and 108, the output of the NAND gate connected to the input buffer 110, 112, 114, or 116 will toggle if the signal applied to the corresponding input pin 102, 104, 106, or 108 is toggled and if none of the signals applied to the other input pins is changed.

FIG. 2 illustrates a normal timing diagram 200 for the NAND logic tree 100 of FIG. 1. In this example, an even number of input pins and non-inverting input buffers are assumed to simplify the illustration.

In FIG. 2, the successive transitions from a logic one to a logic zero of the test signal at each of the input pins 102, 104, 106, and 108 result in the toggled signal at the NAND logic tree test output pin 136.

However, if any of the signals applied to one of the NAND gates downstream from the toggled NAND gate signal is a logic zero, then the toggled NAND gate signal does not propagate to the NAND logic tree test output pin 136, that is, the NAND logic tree 100 is blocked.

FIG. 3 illustrates a blocked timing diagram 300 for the NAND logic tree of FIG. 1. In this scenario, transitions in the signal applied to input pin 104 are not propagated to the NAND logic tree test output pin 136 after the signal applied to the input pin 106 transitions to a logic zero. However, transitions in the signal applied to input pin 108 are still propagated to the NAND logic tree test output pin 136. In this case, the NAND logic tree 100 is said to be blocked above the NAND gate 122.

The number of test patterns that may be generated for the NAND logic tree 100 of FIG. 1 without resulting in a blocked condition excludes many patterns that may be useful in detecting faults. Accordingly, it is desirable to implement a test circuit that overcomes this limitation, preferably without increasing the number of components in the test circuit.

In one embodiment, a circuit for parametric testing of an integrated circuit includes:

an integrated circuit having a plurality of input buffers; and a plurality of XOR gates each having a first input that is connected to an output of one of the input buffers and having a second input that is connected to an output of a preceding XOR gate to form an XOR logic tree.

FIG. 4 illustrates an XOR logic tree 400 for generating an unblocked test signal. Shown in FIG. 4 are input pins 102, 104, 106, and 108, input buffers 110, 112, 114, and 116, functional logic clouds 126, 128, 130, and 132, XOR gates 402, 404, 406, and 408, an XOR logic tree output buffer 410, and an XOR logic tree test output pin 412.

In the embodiment of FIG. 4, the same topology of FIG. 1 is used to construct the XOR logic tree 400, except that the NAND gates are replaced by the exclusive-OR (XOR) gates 402, 404, 406, and 408. The XOR gates 402, 404, 406, and 408, the XOR logic tree output buffer 410, and the XOR logic tree output pin 412 constitute a circuit for testing the input buffers 110, 112, 114, and 116 without increasing the number of components required in the test circuit. Each of the XOR gates 402, 404, 406, and 408 may be any logic circuit that performs a function that is equivalent to an exclusive-OR function or the negation of an exclusive-OR function. For example, some of the XOR gates 402, 404, 406, and 408 may be an exclusive-OR function, and some may be a negation of an exclusive-OR function to suit specific applications.

Each of the input buffers 110, 112, 114, and 116 is connected respectively to one of the input pins 102, 104, 106, and 108 to propagate an input signal from an input pin to one of the functional logic clouds 126, 128, 130, and 132 in the same manner as in FIG. 1.

The output of each of the input buffers 110, 112, 114, and 116 is also connected respectively to one input of each of the XOR gates 402, 404, 406, and 408. The other input of each of the XOR gates 402, 404, 406, and 408 is connected to the output of the preceding XOR gate in the XOR logic tree 400. The output of the XOR gate preceding the first XOR gate 402 in the XOR logic tree 400 is defined as a logic one or as a logic zero, for example, by connecting one input of the first XOR gate 402 to either the supply voltage rail (VCC) or to ground (GND), depending on the desired polarity of the test output signal at the XOR logic tree output pin 412.

The XOR logic tree output buffer 410 is connected to the output of the last XOR gate 408 in the XOR logic tree 400. The output from the XOR logic tree output buffer 410 is connected to the XOR logic tree test output pin 412 for observation and verification of the chip input buffers during chip testing. When a test pattern signal is applied to each of the input pins 102, 104, 106, and 108, the output of the XOR gate connected to an input buffer 110, 112, 114, or 116 will toggle if the signal applied to the corresponding input pin 102, 104, 106, or 108 is toggled and if none of the signals applied to the other input pins is changed.

FIG. 5 illustrates a timing diagram 500 for the XOR logic tree 400 of FIG. 4. In this example, an even number of input pins and non-inverting input buffers are assumed to simplify the illustration as in FIG. 2.

In FIG. 5, the successive transitions from a logic one to a logic zero of the test signal at each of the input pins 102, 104, 106, and 108 result in the toggled signal at the XOR logic tree output pin 412. In this arrangement, transitions in the signal applied to input pin 104 are propagated to the XOR logic tree test output pin 412 even after the signal applied to input pin 106 transitions to a logic zero. As a result, the XOR logic tree 400 is not blocked for any test pattern applied to the input pins 102, 104, 106, and 108, advantageously increasing the number of possible test patterns that may be used to test the chip.

In another embodiment, a method for parametric testing of an integrated circuit includes steps of:

(a) providing an integrated circuit having a plurality of input buffers;

(b) connecting an output of each of the input buffers to a first input of one of a plurality of XOR gates respectively; and (c) connecting a second input of each of the plurality of XOR gates to an output of a preceding XOR gate respectively to form an XOR logic tree.

FIG. 6 illustrates a flow chart 600 of a method of testing input buffers in an integrated circuit.

Step 602 is the entry point of the flow chart 600.

In step 604, an integrated circuit having a plurality of input buffers is provided according to well-known techniques.

In step 606, an output of each of the input buffers is connected to a first input of an XOR gate.

In step 608, a second input of the XOR gate is connected to an output of a preceding XOR gate to form an XOR logic tree.

In step 610, the preceding XOR gate connected to the second input of the first XOR gate in the XOR logic tree is defined as a logic zero or a logic one by connecting the second input of the first XOR gate to the ground rail (GND) or to the supply voltage rail (VCC).

In step 612, a test pattern is applied at the chip inputs of the input buffers. The test pattern may be generated and applied to the chip inputs, for example, by standard test equipment used to test integrated circuit chips.

In step 614, the transitions between logic states at the output of the last XOR gate in the XOR gate logic tree in response to the test pattern are observed.

In step 616, if the output of the last XOR gate fails to switch between logic states when the test pattern changes, then the flow chart continues from step 620. This type of fault may indicate a short circuit. Otherwise, the flow chart continues from step 618.

In step 618, if the output of the last XOR gate switches between logic states when the test pattern has not changed, then the flow chart continues from step 620. This type of fault may indicate an open circuit. Otherwise, the flow chart continues from step 622.

In step 620, a fault is reported along with the test pattern transition that resulted in the fault for corrective action.

Step 622 is the exit point of the flow chart 600.

The XOR gate logic tree described above may also be used in conjunction with existing integrated circuit design tools and libraries that use NAND gate logic trees by replacing one or more of the NAND gates with XOR gates. An XOR gate logic tree may be combined with a NAND gate logic tree in this manner to obtain the benefits of the XOR gate logic tree described above.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A circuit comprising:
an integrated circuit having a plurality of input buffers; and
a plurality of XOR gates each having a first input that is connected to an output of one of the plurality of input buffers and having a second input that is connected to an output of a preceding XOR gate to form an XOR logic tree wherein the XOR logic tree replaces at least one NAND gate in a NAND gate logic tree.

2. A method comprising steps of:
(a) providing an integrated circuit having a plurality of input buffers;
(b) connecting an output of each of the input buffers to a first input of one of a plurality of XOR gates respectively; and
(c) connecting a second input of each of the plurality of XOR gates to an output of a preceding XOR gate respectively to form an XOR logic tree wherein the XOR logic tree replaces at least one NAND gate in a NAND gate logic tree.

3. A method comprising steps of:
(a) providing an integrated circuit having a plurality of input buffers;
(b) connecting an output of each of the input buffers to a first input of one of a plurality of XOR gates respectively;
(c) connecting a second input of each of the plurality of XOR gates to an output of a preceding XOR gate respectively to form an XOR logic tree;
(d) applying a test pattern at chip inputs of the input buffers;
(e) observing transitions between logic states at an output of a last XOR gate in the XOR logic tree in response to the test pattern;
(f) continuing from step (h) when the output of the last XOR gate fails to switch between logic states when the test pattern changes, else continuing from step (g);
(g) continuing from step (h) when the output of the last XOR gate switches between logic states when the test pattern has not changed, else continuing from step (i);
(h) reporting a fault along with a test pattern transition that resulted in the fault and
(i) terminating wherein at least one of the plurality of XOR gates performs a function that is equivalent to an exclusive-OR function and at least one of the plurality of XOR gates performs a function that is equivalent to a negation of an exclusive-OR function.

4. A method comprising steps of:
(a) providing an integrated circuit having a plurality of input buffers;
(b) connecting an output of each of the input buffers to a first input of one of a plurality of XOR gates respectively;
(c) connecting a second input of each of the plurality of XOR gates to an output of a preceding XOR gate respectively to form an XOR logic tree;
(d) applying a test pattern at chip inputs of the input buffers;
(e) observing transitions between logic states at an output of a last XOR gate in the XOR logic tree in response to the test pattern;
(f) continuing from step (h) when the output of the last XOR gate fails to switch between logic states when the test pattern changes, else continuing from step (g);
(g) continuing from step (h) when the output of the last XOR gate switches between logic states when the test pattern has not changed, else continuing from step (i);
(h) reporting a fault along with a test pattern transition that resulted in the fault and
(i) terminating wherein the XOR logic tree replaces at least one NAND gate in a NAND gate logic tree.

* * * * *